US006908695B2

(12) United States Patent
Seo et al.

(10) Patent No.: US 6,908,695 B2
(45) Date of Patent: Jun. 21, 2005

(54) LIGHT-EMITTING DEVICE AND MANUFACTURING METHOD THEREOF

(75) Inventors: Satoshi Seo, Atsugi (JP); Satoko Shitagaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/189,439

(22) Filed: Jul. 8, 2002

(65) Prior Publication Data

US 2003/0020088 A1 Jan. 30, 2003

(30) Foreign Application Priority Data

Jul. 13, 2001 (JP) .......................... 2001-213139

(51) Int. Cl.$^7$ ............................................. H05B 33/04
(52) U.S. Cl. .................... 428/690; 313/504; 313/506; 428/691; 428/917; 528/422; 528/498
(58) Field of Search ................. 313/504, 506; 428/690, 691, 917; 528/422, 498; 257/91, 96, 99, 103

(56) References Cited

U.S. PATENT DOCUMENTS

| | | | | |
|---|---|---|---|---|
| 5,652,067 A | * | 7/1997 | Ito et al. ..................... | 428/690 |
| 6,280,861 B1 | * | 8/2001 | Hosokawa et al. .......... | 428/690 |
| 6,515,417 B1 | * | 2/2003 | Duggal et al. ............... | 313/506 |
| 6,563,263 B1 | * | 5/2003 | Kawaguchi et al. ......... | 313/509 |
| 2001/0041270 A1 | | 11/2001 | Maruyama et al. | |

FOREIGN PATENT DOCUMENTS

| | | |
|---|---|---|
| EP | 1 143 773 | 10/2001 |
| JP | 08-060145 | 3/1996 |
| JP | 2001-189193 | 7/2001 |

OTHER PUBLICATIONS

C.W. Tang and S.A. VanSlyke, "Organic Electroluminescent Diodes," Applied Physics Letters, 1987, vol. 51, No. 12, pp. 913–915.
C.W. Tang, S.A. VanSlyke and C.H. Chen, "Electroluminescence of Doped Organic Thin Films," J. Appl. Phys., 1987, vol. 55, No. 9, pp. 3510–3516.
Office Action, Japanese Patent Office, Dated Mar. 1, 2005 for JP Application No. 2002–200496.

* cited by examiner

*Primary Examiner*—David Nelms
*Assistant Examiner*—Dao H. Nguyen
(74) *Attorney, Agent, or Firm*—Eric J. Robinson; Robinson Intellectual Property Law Office, P.C.

(57) ABSTRACT

A light emitting element having a superior light emitting characteristic is provided by forming a region partly including a phosphor (light emitting region) in manufacturing of a light emitting element having an organic compound layer using a high molecular weight material. A solution in which a high polymer having a degree of polymerization of 50 or more is dissolved in a solvent is applied by a spin coating method, and then a low polymer which is composed of the same repetition units as the high polymer and has a degree of polymerization of 2 to 5 and a phosphor are coevaporated to form a light emitting region (105) and only a low polymer is vapor-deposited on the light emitting region to form an organic compound layer (103). Thus, the light emitting region (105) can be partly formed.

11 Claims, 12 Drawing Sheets

FIG. 5A element structure
FIG. 5B composition of material
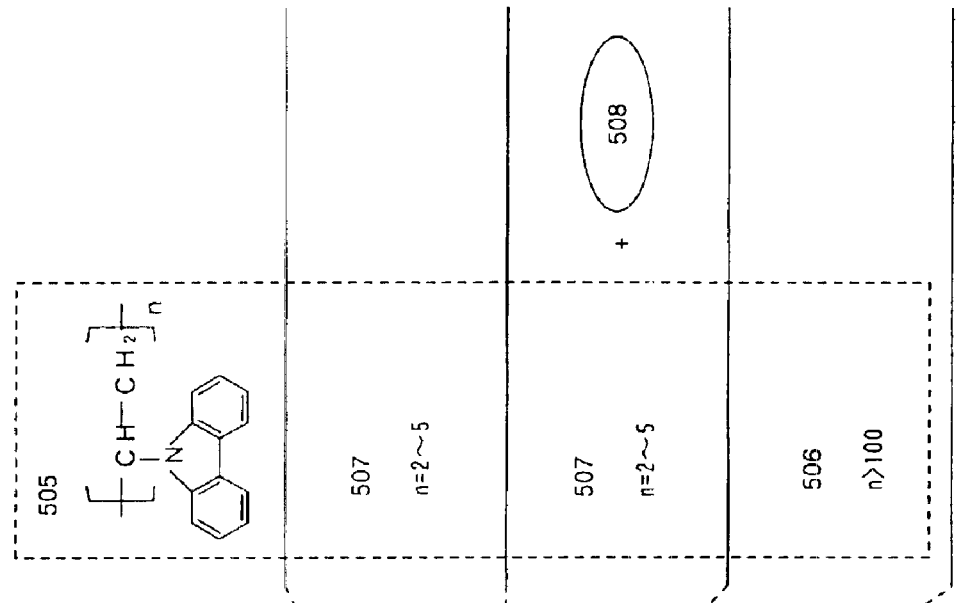

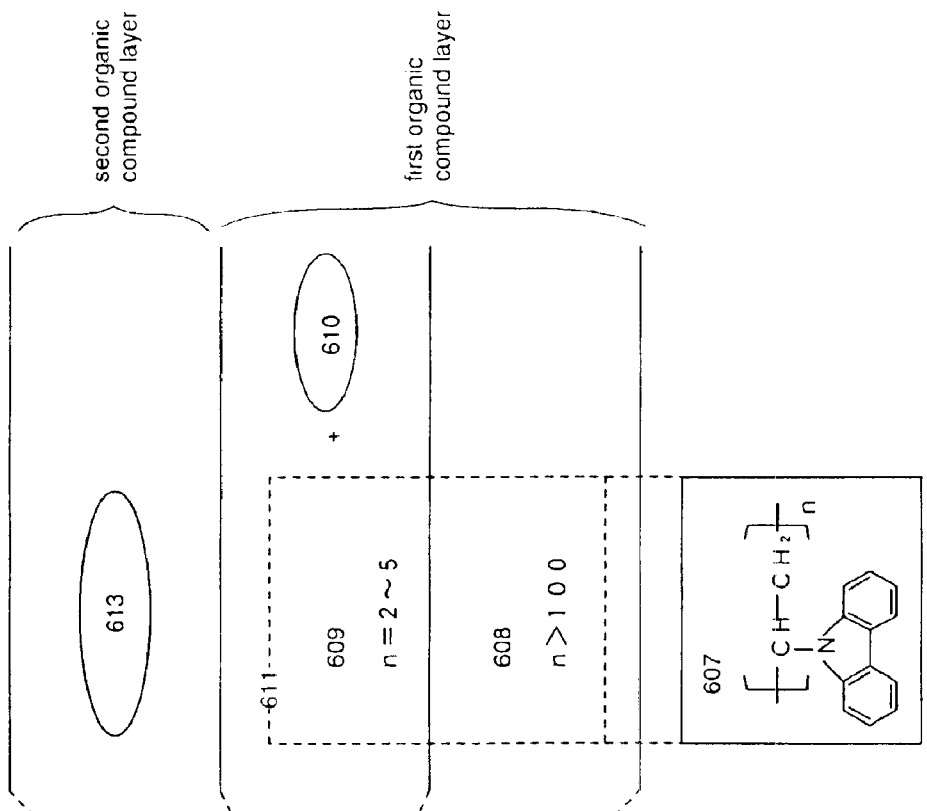
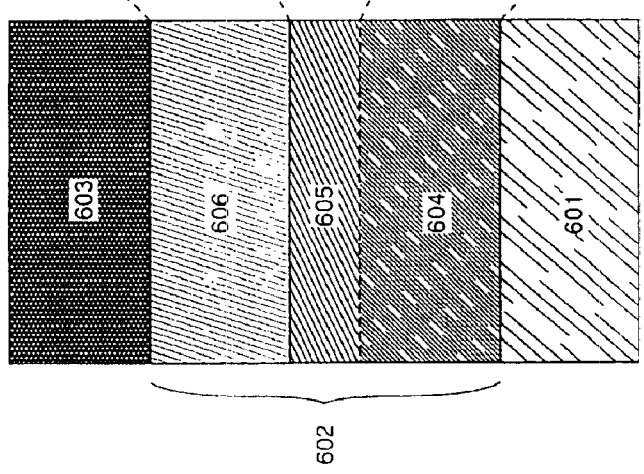
FIG. 6A element structure
FIG. 6B composition of material

700: switching TFT, 701 (701a, 701b): gate electrode, 702: gate wiring, 703: source wiring
704: drain wiring, 705: current control TFT, 706: gate electrode, 707: current supply line
708: drain wiring, 709: anode, 710: gate wiring, 711: erasing TFT, 712: gate electrode,
713: capacitor, 714: semiconductor film, 715: light emitting element, 716: counter electrode

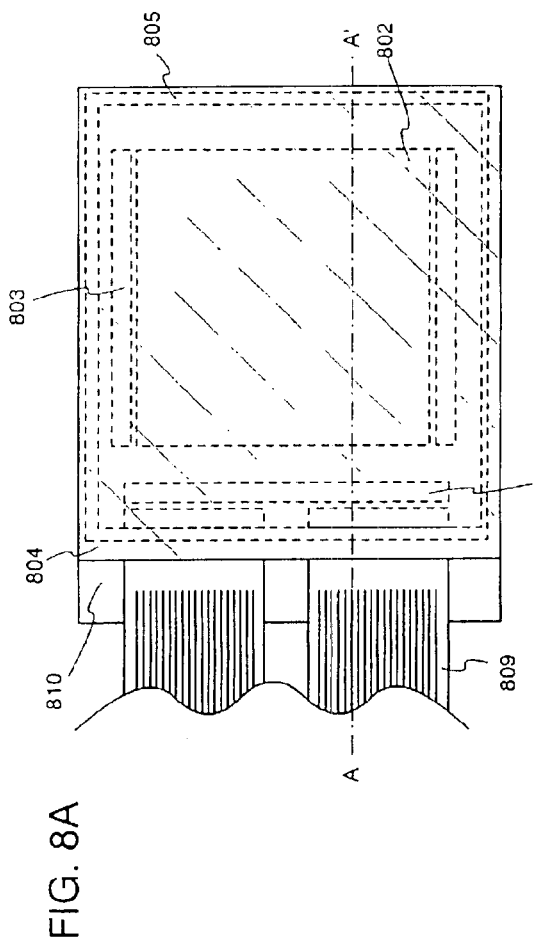
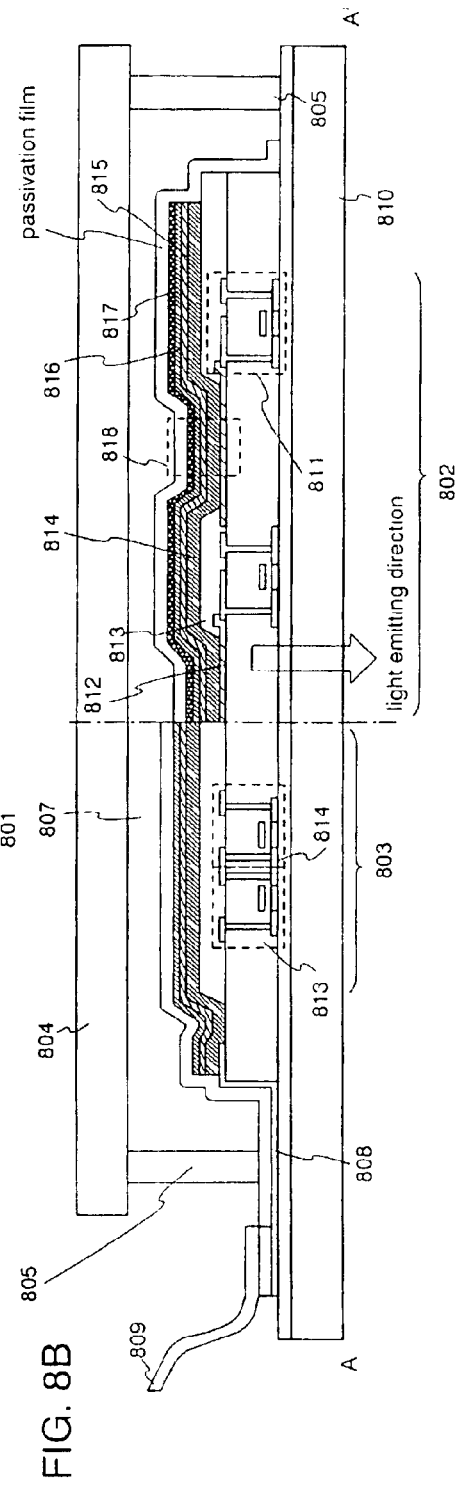
FIG. 8A
FIG. 8B

LIGHT-EMITTING DEVICE AND MANUFACTURING METHOD THEREOF

BACKGROUND OF THE INVENTION

1. Field of the Invention

The present invention relates to a light-emitting device having a light emitting element using a high molecular weight organic compound (high molecular weight material). In particular, the present invention relates to a light emitting device in which an organic compound (polymer) composed of the same repetition units partly includes a phosphor and a manufacturing method thereof. Note that a light-emitting device in this specification indicates an image display device, a light-emitting device or a light source. Also, a module in which a connector, for example, an FPC (flexible printed circuit), a TAB (tape automated bonding) tape, or a TCP (tape carrier package) is attached to the light emitting element, a module in which a printed wiring board is provided in the end of the TAB tape or the TCP, and a module in which an IC (integrated circuit) is directly mounted on the light emitting element by a COG (chip on glass) method are included all in the light-emitting device.

2. Description of the Related Art

A light emitting element in the present invention is an element for emitting light by applying an electric field thereto. With respect to the light emitting mechanism, it is said that an electron injected from a cathode and a hole injected from an anode are recombined in an organic compound layer by applying a voltage to electrodes sandwiching an organic compound layer to produce a molecule with an excitation state (hereinafter referred to as "a molecular exciton") and the molecular exciton releases energy to emit light when it is returned to a ground state.

Note that, although it is considered that a singlet excitation state and a triplet excitation state are possible with respect to a kind of molecular exciton produced by the organic compound, either excitation state is included in this specification when it contributes to light emission.

In such a light emitting element, the organic compound layer is generally made from a thin film having a thickness less than 1 $\mu$m. In addition, since the light emitting element is a self-luminous type element such that the organic compound layer itself emits light, a back light used in a conventional liquid crystal display is not required. Thus, it is the big advantage that an extremely thin and lightweight light emitting element can be manufactured.

Also, when the carrier mobility of, for example, an organic compound layer having a thickness of about 100 nm to 200 nm is considered, a period from the injection of a carrier to the recombination is about several ten nanoseconds. Even when a period required for a process from the recombination of a carrier to light emission is included in the period, light emission is conducted within the order of microsecond. Thus, an extremely high response speed is one of characteristics thereof.

Further, since the light emitting element is a carrier injection type light emitting element, it can be driven by a direct current voltage and a noise is hard to generate. With respect to a drive voltage, the organic compound layer is made from a uniform ultra thin film having a thickness of about 100 nm, an electrode material such that a carrier injection barrier to the organic compound layer is decreased is selected, and a hetero structure (two-layers structure) is introduced. Thus, a sufficient luminance of 100 cd/m$^2$ at 5.5 V has been achieved (Reference 1: C. W. Tang and S. A. VanSlyke, "Organic electroluminescent diodes" Applied Physics Letters, vol. 51, No. 12, pp. 913–915 (1987)).

From characteristics such as a thin type, lightweight, high speed responsibility, and direct-current low-voltage drive, the light emitting element has been noted as a next generation flat panel display element. In addition, since the light emitting element is a self-luminous type and has a wide viewing angle, the visibility is relatively good. Thus, it is considered that the light emitting element is effective as an element used for a display screen of a portable device.

Now, a material composing the organic compound layer is broadly categorized into two materials: a low molecular weight material and a high molecular weight material.

If comparisons are conducted from the film formation aspect, those are different in the following point. That is, although the low molecular weight material is formed as a thin film on a substrate by a vacuum evaporation method, the high molecular weight material is formed from a solution of an organic solvent on a substrate by a wet process such as spin coating. Note that, when the film formation is conducted by the vacuum evaporation method, conventional patterning using a shadow mask technique is possible. In addition, there is an advantage that the purity of a material can be kept because of a dry process in a vacuum. On the other hand, in the case of the spin coating method, there is an advantage that the film formation on a large area substrate is easy and can be conducted for a short time at a low cost. Therefore, the development of an element capitalizing respective characteristics has been progressed.

However, when it is considered from the material aspect, it is an advantage that the high molecular weight material having physical properties such that a mechanical strength is large and cohesion and crystallization are hard to produce is used. When the high molecular weight material has a large mechanical strength, a flexible element capable of tensile and bending processings can be manufactured. When cohesion and crystallization are hard to produce, a use under a high temperature condition can be expected. In other words, when the high molecular weight material is used, a condition for manufacturing an element is relaxed and the variety of use can be expected.

Also, a light emitting region including a phosphor is formed in a portion of an organic compound layer to set a recombination region of carrier. Thus, the diffusion of carrier is prevented, the recombination region can be distanced from electrodes, and a light emitting characteristic is improved by two times (Reference 2: C. W. Tang, S. A. VanSlyke, and C. H. Chen; Electro Luminescence of Doped Organic Thin Films; J. Appl. Phys., vol. 55, No. 9, pp. 3510–3515 (1987)).

Also, although it is different from the case where a phosphor is included in a portion of the organic compound layer of a light emitting element using a high molecular weight material and the light emitting region is formed therein, a laminate structure as shown in FIG. 11 has been well known.

In FIG. 11, an anode 1102, an organic compound layer 1103, and a cathode 1104 are formed on a substrate 1101. The organic compound layer 1103 becomes a laminate structure of a hole transport layer 1105 and a light emitting layer 1106. Here, the hole transport layer 1105 is made of PEDOT (poly(3,4-ethylene dioxythiophene)) and polystyrene sulfonic acid (PSS) as an acceptor material and the light emitting layer 1106 is made of a copolymer of polyparaphenylene vinylene. Note that, since a material having different solubility to a solvent is used for each of these layers, a laminate structure can be formed.

However, the report in which the light emitting region including a phosphor is formed in a portion of the organic compound layer to set a recombination region of carrier is made in the case where the low molecular weight material is used. When the high molecular weight material is used, there is a problem that the formation of the light emitting region partly including a phosphor is difficult from the material characteristic.

Also, in the case of the laminate structure as shown in FIG. 11, a functional separation by the laminate structure using the high molecular weight material is possible. On the other hand, since a material composing the hole transport layer 1105 is different from that composing the light emitting layer 1106, there is also a problem that quenching due to energy transfer in the laminate interface therebetween is easy to cause.

SUMMARY OF THE INVENTION

Therefore, in order to solve the above problems, an object of the present invention is to form a region partly including a phosphor (light emitting region) without using a different high molecular weight material for an organic compound layer in the case where a light emitting element including the organic compound layer using a high molecular weight material is manufactured, thereby producing a light emitting element having a superior light emitting characteristic.

Also, a light-emitting device having an element characteristic superior to a conventional device is provided by using such a light emitting element. Further, an electric appliance manufactured using the light-emitting device is provided.

The present invention is characterized in that the region including a phosphor, that is, the light emitting region is formed in a portion of the organic compound layer made of a high molecular weight material. Note that, with respect to the high molecular weight material in the present invention, among polymers which are composed of the same repetition units (the same main chain structure suffices therefor), a polymer which has a degree of polymerization of 2 to 5 is called a low polymer and a polymer having a degree of polymerization of 50 or more is called a high polymer.

Conventionally, the high molecular weight material is dissolved in a solvent to produce a solution and a film is formed by an ink-jet method or spin coating method. Thus, it is impossible to form a light emitting region in a portion of the organic compound layer and there is a limitation to obtain a laminate structure utilizing a dissolving characteristic of the high molecular weight material.

The present invention is characterized in that a solution in which a high polymer having a degree of polymerization of 50 or more is dissolved in a solvent is applied by a spin coating method, and then a low polymer which is composed of the same repetition units as the high polymer and has a degree of polymerization of 2 to 5 and a phosphor are coevaporated to form a light emitting region and only a low polymer is vapor-deposited on the light emitting region to form an organic compound layer. Note that, according to the present invention, since both the high polymer and the low polymer are composed of the same repetition units, an injection barrier in a laminate interface can be minimized.

Further, the light emitting region formed in the portion of the organic compound layer can be distanced from both an anode and a cathode without being in contact therewith. Thus, quenching due to energy transfer to both electrodes can be prevented.

According to a structure of the invention disclosed in the present specification, there is provided a light-emitting device comprising a light emitting element including an anode, an organic compound layer, and a cathode, in which the organic compound layer is made of a high molecular weight material and has partly a light emitting region including a low polymer and a phosphor.

According to another structure of the present invention, there is provided a light-emitting device comprising a light emitting element including an anode, an organic compound layer, and a cathode, in which the organic compound layer is made of a high molecular weight material having the same repetition unit and has partly a light emitting region including a phosphor.

According to yet another structure of the present invention, there is provided a light-emitting device comprising a substrate having an insulating surface, a TFT provided on the insulating surface of the substrate, and a light emitting element including an anode, an organic compound layer, and a cathode and electrically connected with the TFT, in which the organic compound layer is made of a high molecular weight material and has partly a light emitting region including a low polymer and a phosphor.

According to yet another structure of the present invention, there is provided a light-emitting device comprising a substrate having an insulating surface, a TFT provided on the insulating surface of the substrate, and a light emitting element including an anode, an organic compound layer, and a cathode and electrically connected with the TFT, in which the organic compound layer is made of a high molecular weight material having the same repetition unit and has partly a light emitting region including a phosphor.

In the light-emitting device of the present invention, it is possible to use a low molecular weight material for a portion of an organic compound layer, and according to yet another structure of the invention, there is provided a light-emitting device comprising a light emitting element including an anode, an organic compound layer, and a cathode, in which: the organic compound layer is formed to be sandwiched between the anode and the cathode and includes a first organic compound layer made of a high molecular weight material and a second organic compound layer made of a low molecular weight material; the first organic compound layer has partly a light emitting region including a low polymer and a phosphor; and the second organic compound layer is formed in contact with the cathode.

According to yet another structure of the invention, there is provided a light-emitting device comprising a light emitting element including an anode, an organic compound layer, and a cathode, in which: the organic compound layer is formed to be sandwiched between the anode and the cathode and includes a first organic compound layer made of a high molecular weight material and a second organic compound layer made of a low molecular weight material; the first organic compound layer is made of a high molecular weight material having the same repetition unit and has partly a light emitting region including a phosphor; and the second organic compound layer is formed in contact with the cathode.

In the above respective structures, the high molecular weight material is made of one of a low polymer having a degree of polymerization of 2 to 5 and a high polymer having a degree of polymerization of 50 or more which have the same repetition unit.

In the above respective structures, the light-emitting device of the present invention is characterized in that the high molecular weight material includes one of N-vinylcarbazole and fluorene as a repetition unit.

In the above respective structures, the light-emitting device of the present invention is characterized in that the phosphor is a fluorescent material or a phosphorescent material, and is one or more elements selected from the group consisting of 1,1,4,4-tetraphenyl-1,3-butadiene (hereinafter referred to as "TPB"), 4,4'-bis(N-(1-naphthyl)-N-phenyl-amino)-biphenyl (hereinafter referred to as "α-NPD"), perylene, coumarin 6,4-dicyanomethylene-2-methyl-6-(p-dimethylamino-styryl)-4H-pyran (hereinafter referred to as "DCM1"), 4-dicyanomethylene-2-methyl-6-(julolidine-4-yl-vinyl)-4H-pyran (hereinafter referred to as "DCM2"), rubrene, Nile Red, N,N'-dimethyl-quinacridone (hereinafter referred to as dimethyl quinacridone), anthracene, pyrene, 9,10-diphenylanthracene, tris(2-phenylpyridine)iridium (hereinafter referred to as "Ir(ppy)$_3$"), and 2,3,7,8,12,13,17,18-octaethyl-21H,23H-porphyrin-platinum (hereinafter referred to as "PtOEP").

In the above respective structures, the light-emitting device of the present invention is characterized in that the second organic compound layer is made of the low molecular weight material having one of an electron transport property and a hole blocking property.

Moreover, in the above respective structures, the light-emitting device of the present invention is characterized in that the second organic compound layer comprises an aluminum complex having quinoline skeleton, which has an electron transport property, specifically tris (8-quinolinolato)-aluminum (hereinafter referred to as "Apq$_3$"), tris (4-methyl-8-quinolinolato) aluminum (hereinafter referred to as "Almq") or bis (2-methyl-8-quinolinolato)-(4-phenyl-phenolato)-aluminum (hereinafter referred to as "BAlq"), and in addition to this, a zinc complex having benzoxazole skeleton or benzothiazole skeletons, specifically bis(2-(2-hydroxyphenyl)-benzoxazolato-zinc (hereinafter referred to as "Zn(PBO)$_2$") or bis(2-(2-hydroxyphenyl)-benzothiazolato)-zinc (hereinafter referred to as "Zn(PBT)$_2$").

Furthermore, in the above respective structures, the light-emitting device of the present invention is characterized in that the second organic compound layer comprises (2-(4-biphenylyl)-5-(4-t-butylphenyl)-1,3,4-oxadiazole (hereinafter referred to as "PBD"), bathocuproine (hereinafter referred to as "BCP") or bathophenanthroline, which are 1,3,4-oxadiazole derivatives, or 5-(4-biphenylyl)-3-(4-tert-butylphenyl)-4-phenyl-1,2,4-triazole (hereinafter referred to as "TAZ"), which is a 1,2,4-triazole derivative as a material having the hole blocking property.

Also, there is no case where the organic compound layer in the above respective structures is made of only the organic material described above. The organic compound layer can be also formed by combining a known inorganic material with a portion thereof. That is, the organic compound layer of the present invention includes an organic compound layer partly having an inorganic material.

Conventionally, when the high molecular weight material is used, the light emitting region cannot be partly set. However, according to the structures of the present invention as indicated above, since the light emitting region can be partly formed in the organic compound layer made of the high molecular weight material, quenching due to energy transfer can be prevented. Thus, an element characteristic of the light emitting element can be improved.

Note that light emission produced from the light-emitting device of the present invention includes light emission due to at least one of a singlet excitation state and a triplet excitation state.

Also, according to a structure with respect to a method of manufacturing a light-emitting device as disclosed in this specification, there is provided a method of manufacturing a light-emitting device characterized in that a high polymer is added onto an anode by an application method to form a first organic compound layer, and then a low polymer and a phosphor are vapor-deposited on the first organic compound layer by a coevaporation method to form a light emitting region and further a low polymer is vapor-deposited on the light emitting region by an evaporation method to form a second organic compound layer, so that an organic compound layer is obtained which is composed of the first organic compound layer, the light emitting region, and the second organic compound layer.

Also, when the light-emitting device of the present invention is manufactured, a low molecular weight material may be used for a portion of the organic compound layer. According to another structure of the present invention, there is provided a method of manufacturing a light-emitting device characterized in that a high polymer is added onto an anode by an application method to form a first organic compound layer, and then a low polymer and a phosphor are vapor-deposited on the first organic compound layer by a coevaporation method to form a light emitting region and further a low molecular weight material is vapor-deposited on the light emitting region by an evaporation method to form a second organic compound layer, so that an organic compound layer is obtained which is composed of the first organic compound layer, the light emitting region, and the second organic compound layer.

Note that in the above respective structures, the manufacturing method of the invention is characterized in that the application method is a spin coating method, a printing method, or an ink-jet method.

Note that in the above respective structures, the manufacturing method of the invention is characterized in that the high polymer has the solubility to an organic solvent and the low polymer and the low molecular weight material can be used for film formation by an evaporation method.

Also, in the above respective structures, the manufacturing method of the invention is characterized in that one of a low polymer having a degree of polymerization of 2 to 5 and a high polymer having a degree of polymerization of 50 or more which have the same repetition unit is used as the high molecular weight material.

Also, in the above respective structures, the manufacturing method of the invention is characterized in that a material including one of N-vinylcarbazole and fluorene as a repetition unit is used as the high molecular weight material.

Moreover, in the above respective structures, the manufacturing method of the invention is characterized in that at least one element selected from the group consisting of TPB, α-NPD, perylene, coumarin 6, DCM1, DCM2, rubrene, Nile Red, dimethylquinacridone, anthracene, pyrene, 9,10-diphenylanthracene, Ir(ppy)$_3$ and PtOEP is used as the phosphor.

Furthermore, in the above respective structures, the manufacturing method of the invention is characterized in that at least one solvent selected from the group consisting of toluene, benzene, chlorobenzene, dichlorobenzene, chloroform, tetralin, xylene, dichlorometahne, cyclohexane, NMP (N-methyl-2-pyrrolidone), dimethylsulfoxide, cyclohexanone, dioxane and THF (tetrahydrofuran) is used as the organic solvent.

Also, in the above respective structures, the manufacturing method of the invention is characterized in that a material having one of an electron transport property and a hole blocking property is used as the low molecular weight material.

Also, in the above respective structures, the manufacturing method of the invention is characterized in that $Alq_3$, Almq, BAlq, $Zn(PBO)_2$, or $Zn(PBT)_2$ is used as a material having an electron transport property.

Also, in the above respective structures, the manufacturing method of the invention is characterized in that PBD, BCP, vasophenanthroline, or TAZ is used as a material having a hole blocking property.

BRIEF DESCRIPTION OF THE DRAWINGS

In the accompanying drawings:

FIGS. 5A and 5B are explanatory views for showing an element structure and composition of materials of a light-emitting device according to the present invention;

FIGS. 6A and 6B are explanatory views for showing an element structure and composition of materials of a light-emitting device according to the present invention;

FIGS. 8A and 8B are explanatory views for showing an active matrix light emitting device;

DETAILED DESCRIPTION OF THE PREFERRED EMBODIMENTS

An embodiment mode of the present invention will be described using FIGS. 1 and 2A to 2D. A light-emitting device of the present invention includes a light emitting element having an element structure as shown in FIG. 1.

Figure 1:
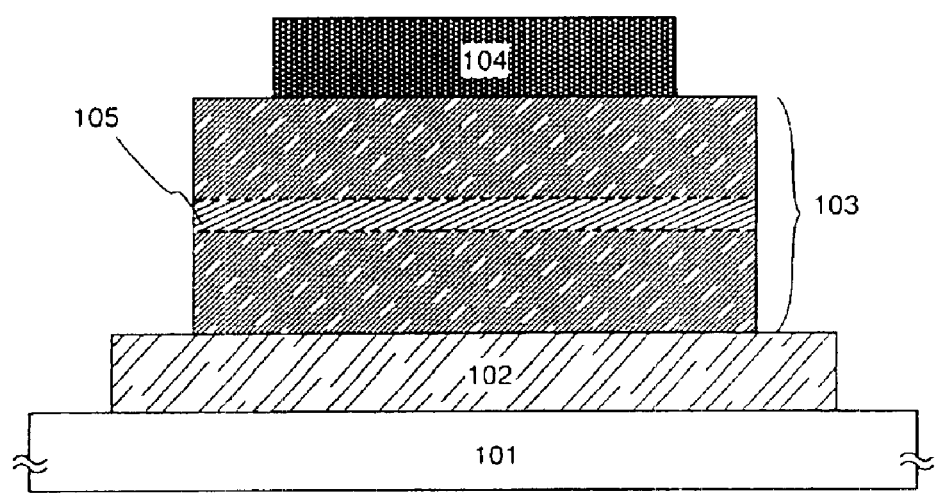
FIG. 1 is an explanatory view for showing an element structure of a light-emitting device according to the present invention.

As shown in FIG. 1, an anode 102 is formed on a substrate 101 and an organic compound layer 103 is formed to be sandwiched by the anode 102 and a cathode 104. Note that, in this embodiment mode, the organic compound layer 103 is made of a polymer in which a plurality of the same repetition units are polymerized.

Also, a phosphor which possibly becomes a luminescent center is partly included in a portion of the organic compound layer 103 and a light emitting region 105 is formed therein.

Figure 2A:
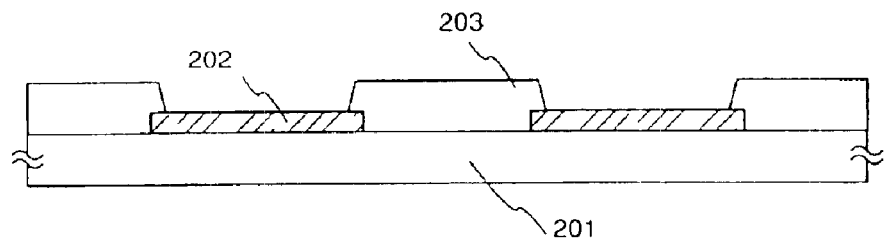
FIGS. 2A to 2D are explanatory views for showing steps of manufacturing the light-emitting device according to the present invention.

Next, a method of manufacturing the light emitting element shown in FIG. 1 will be described using FIGS. 2A to 2D. As shown in FIG. 2A, an anode 202 is formed on a substrate 201. Note that in the present invention, glass or quartz, which is transparent, is used for the substrate 201 and a transparent conductive material is used for the anode 202.

Also, an insulating film made of an insulating material is formed on the anode 202. Note that, when the insulating film formed on the anode 202 is partly etched, an insulating layer 203 can be formed to cover end portions of the anode 202.

Figure 2B:
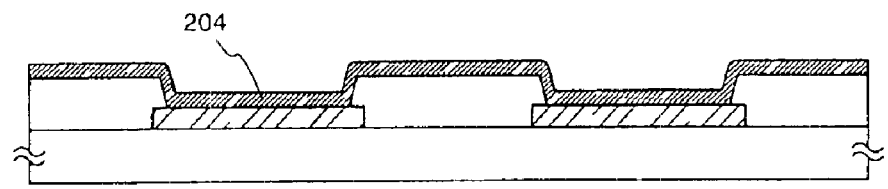

Next, as shown in FIG. 2B, a first organic compound layer 204 is formed on the anode 202 and the insulating layer 203. Note that in this embodiment mode, a material having a large work function and a hole transport property is preferable as a high molecular weight material composing the first organic compound layer 204, and a high polymer having a degree of polymerization (n) of 50 or more is used.

Note that, here, a solution in which a high polymer is dissolved in an organic solvent is applied by a spin coating method and heated at 60° C. to 80° C. for 20 minutes to 30 minutes to remove the organic solvent. Thus, the first organic compound layer 204 is obtained. Note that a processing atmosphere at this time may be set to be a vacuum.

Then, a light emitting region 205 is formed on the first organic compound layer 204. Note that the light emitting region 205 is formed by coevaporation using a low polymer which is composed of the same repetition units as the high polymer used as the material for the first organic compound layer 204 and has a degree of polymerization (n) of 2 to 5 and a phosphor which becomes a luminescent center.

Figure 3:
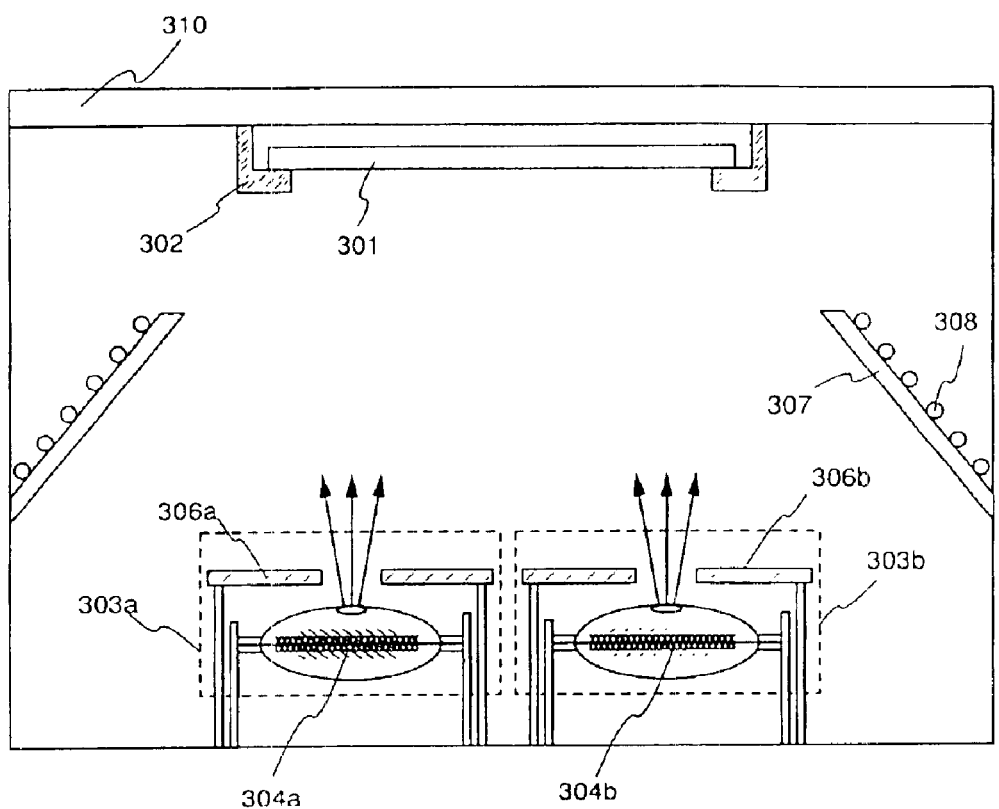
FIG. 3 is an explanatory view for showing an evaporation chamber.

Note that, when the light emitting region 205 is formed, the film formation is conducted in an evaporation chamber as shown in FIG. 3. As shown in FIG. 3, a substrate 301 is held in a holder 302 and evaporation sources 303 (303a and 303b) are provided below. Organic compounds 304 (304a and 304b) are provided for the evaporation sources 303 (303a and 303b). In this embodiment mode, specifically, a low polymer is provided for the evaporation source 303a and a phosphor is provided for the evaporation source 303b. In addition, shutters 306 (306a and 306b) are provided for the evaporation sources 303 (303a and 303b), respectively. Note that, in order to uniformly form a film in a film formation chamber 310, the evaporation sources 303 (303a and 303b) or the substrate 301 subjected to evaporation, is preferably moved (rotated).

Also, the evaporation sources 303 (303a and 303b) are made of a conductive metallic material. When the organic compounds 304 (304a and 304b) provided inside the evaporation sources 303 (303a and 303b) are heated by resistance produced at the application of a voltage thereto, they are vaporized and vapor-deposited on the surface of the substrate 301. Note that, the surface of the substrate 301 in this specification includes the substrate and a thin film formed thereon. Here, an anode is formed on the substrate 301.

Note that the shutters 306 (306a and 306b) are used for controlling the vapor deposition of the vaporized organic compounds 304 (304a and 304b). In other words, when the shutters are opened, the organic compounds 304 (304a and 304b) vaporized by heating can be vapor-deposited.

Also, anti-deposition shields 307 are provided in the film formation chamber 310 so that the organic compounds which are not vapor-deposited on the substrate at evaporation can be deposited. Since the entire anti-deposition shields 307 can be heated by heating wires 308 provided around them, the deposited organic compounds can be vaporized. Thus, the organic compounds which are not vapor-deposited can be recovered again.

Figure 2C:
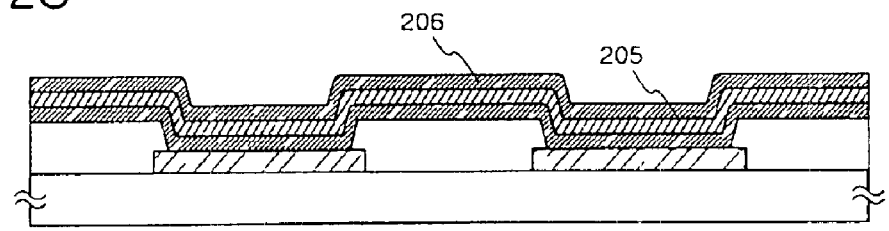
Figure 2D:
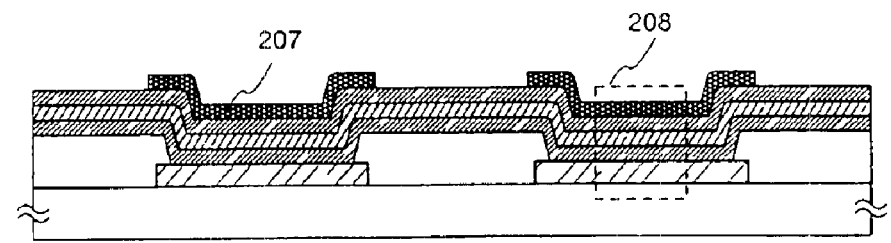

Note that, when a low polymer provided in the first evaporation source 303a and a phosphor provided in the second evaporation source 303b are simultaneously vapor-deposited on the substrate by coevaporation, the light emitting region 205 shown in FIG. 2C is formed.

Next, when only the shutter 306b of the second evaporation source 303b is closed, a second organic compound layer 206 is made of only the low polymer from the first evaporation source 303a (FIG. 2C). Note that, when the film formation is continuously performed here, an impurity contamination in an interface can be prevented.

Finally, a cathode 207 made of a conductive material is formed on the second organic compound layer 206 to produce a light emitting element 208.

By the above steps, the light emitting element having the light emitting region 105 can be formed in a portion of the organic compound layer 103 as shown in FIG. 1.

According to the present invention, since the light emitting region 105 including a phosphor can be formed in a portion of the organic compound layer 103 composed of the same repetition units to set the region for emitting light therein, the light emitting efficiency of the light emitting element can be further improved. In addition, since the light emitting region 105 can be formed at a distance from the electrodes (anode and cathode), quenching due to energy transfer between the light emitting region 105 and the electrodes (anode and cathode) can be prevented.

Figure 4:
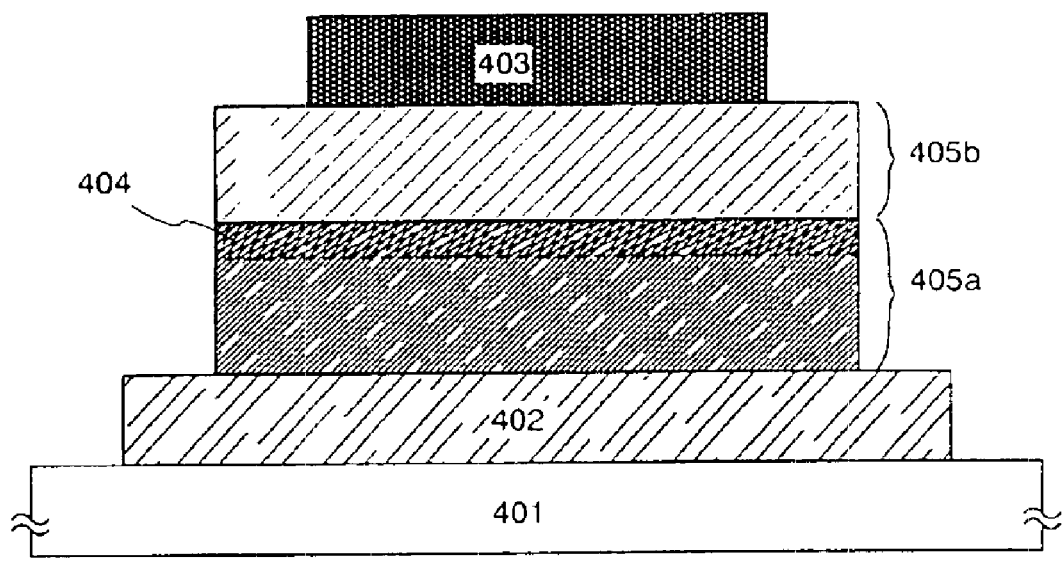
FIG. 4 is an explanatory view for showing an element structure of a light-emitting device according to the present invention.

Further, according to the present invention, not only the element structure shown in FIG. 1 but also a structure as shown in FIG. 4 can be used. In FIG. 4, an anode 402 is formed on a substrate 401, organic compound layers 405 (first organic compound layer 405a and second organic compound layer 405b) are formed on the anode 402, and a cathode 403 is formed on the second organic compound layer 405b. A laminate structure of the first organic compound layer 405a and the second organic compound layer 405b is different from the structure shown in FIG. 1.

In FIG. 4, a high polymer of a high molecular weight material is formed into a film by a spin coating method and a low polymer and a phosphor are coevaporated to form the first organic compound layer 405a partly including a light emitting region 404. After that, the second organic compound layer 405b made of a low molecular weight material is formed by an evaporation method. Note that a material having an electron transport property or a hole blocking property can be used as the low molecular weight material.

Note that the second organic compound layer 405b of the light emitting element shown in FIG. 4 is not made of an organic compound composed of the same repetition units as a material composing the first organic compound layer 405a. However, as in the case of FIG. 1, the light emitting region can be distanced from the electrodes. In addition, a carrier transport property can be improved and a carrier can be selectively blocked. Thus, a recombination property of the carrier can be increased and an element characteristic can be further improved.

[Embodiment 1]

In this embodiment, a light emitting element having the structure explained by using FIG. 1 will be described using FIGS. 5A and 5B.

As shown in FIG. 5A, according to an element structure of a light emitting element in this embodiment, an organic compound layer 502 is formed on an anode 501, a cathode 503 is formed on the organic compound layer 502, and a light emitting region 504 including a phosphor 508 is formed in a portion of the organic compound layer 502.

Also, FIG. 5B shows in detail a composition of materials composing the organic compound layer 502. Note that a high molecular weight material including N-vinylcarbazole as a repetition unit 505 is used in this embodiment. In addition, in this embodiment, N-vinylcarbazole is used as the repetition unit 505, a polymer having a degree of polymerization (n) of 50 or more is called a high polymer 506, and a polymer having a degree of polymerization (n) of 2 to 5 is called a low polymer 507.

Also, in this embodiment, the high polymer 506 can be dissolved in an organic solvent and the low polymer 507 is a material having a sublimation property.

Also, as the organic solvent for dissolving the high polymer in this embodiment, toluene, benzene, chlorobenzene, dichlorobenzene, chloroform, tetralin, xylene, dichloromethane, cyclohexane, NMP (N-methyl-2-pyrrolidone), dimethylsulfoxide, cyclohexanone, dioxane, THF (tetrahydrofuran), or the like can be used.

Also, a fluorescent material and a phosphorescent material can be used for the phosphor 508 in this embodiment.

As fluorescent materials, 1,1,4,4-tetraphenyl-1,3-butadiene (TPB), α-NPD, and perylene in which blue light emission is produced, coumarin 6 in which green light emission is produced, DCM1, rubrene, and Nile Red in which red (orange-red) light emission is produced, dimethylquinacridone in which yellow-green light emission is produced, and the like can be used. In addition, anthracene, pyrene, 9,10-diphenylanthracene, and the like which are condensed polycyclic fluorescent substances can be used.

Also, as phosphorescent materials, $Ir(ppy)_3$ in which green light emission is produced, PtOEP in which red light emission is produced and $Eu(TTA)_3phen$ which is a rare earth metal complex can be used. Further, $Ir(ppy)_3$ and DCM2 can be coevaporated to produce red light emission.

Hereinafter, a method of manufacturing a light emitting element in this embodiment will be described. First, a solution in which a high molecular weight material is dissolved in an organic solvent is applied onto the anode 501 by a spin coating method to form a film. Note that, here, a high polymer including N-vinylcarbazole as a repetition unit is used and a solution in which the high polymer is dissolved in toluene is used. In addition, a high polymer including a fluorene-based compound as a repetition unit can be used in this embodiment.

After the film formation by the spin coating method, it is further heated at 80° C. for 3 minutes to remove toluene to form a film made of the high polymer 506.

Next, the low polymer 507 including N-vinylcarbazole as a repetition unit and the phosphor 508 are simultaneously coevaporated to form the light emitting region 504.

After the formation of the light emitting region 504, only the low polymer 507 including N-vinylcarbazole (degree of polymerization (n)=2 to 5) is formed into a film by an evaporation method to form a film made of the low polymer 507. Note that a thickness of the film formed at this time is preferably 30 nm to 50 nm. In this embodiment, the film is formed at a film thickness of 40 nm. In addition, in this embodiment, the low polymer including N-vinylcarbazole and the PBD can be coevaporated to improve an electron transport property.

By the above steps, the organic compound layer 502 partly including the light emitting region 504 can be formed on the anode 501.

Next, the cathode 503 is formed on the organic compound layer 502. Aluminum can be used as a material composing the cathode 503. In addition, an alloy of magnesium and silver (hereinafter referred to as Mg:Ag), an alloy of magnesium and indium (hereinafter referred to as Mg:In), or an alloy of magnesium and copper (hereinafter referred to as Mg:Cu) can be used. Further, an alloy using calcium as alkali metal in addition to magnesium can be used. Furthermore, an alloy of aluminum and lithium (hereinafter referred to as Al:Li) or the like can be used.

Also, an extremely thin film insulating layer made of a metallic oxide or a metallic fluoride can be formed in an interface between the cathode 503 and the organic compound layer 502. $Li_2O$, MgO, $Al_2O_3$, or the like can be used as the metallic oxide. LiF, $MgF_2$, $SrF_2$ or the like is used as the metallic fluoride and a film made of such a material is preferably formed at a film thickness of 0.5 nm to 1.5 nm.

By the above steps, the light emitting region 504 including the phosphor 508 at a desired position can be formed in the organic compound layer 502 made of the high molecular weight material composed of the same repetition units. Thus, the light emitting region 504 in the organic compound layer 502 can be set in a specific position. In addition, since the light emitting region 504 can be formed at a distance from the electrodes in this embodiment, quenching due to energy transfer can be prevented.

[Embodiment 2]

In this embodiment, the case where a structure of an organic compound layer is different from that indicated in Embodiment 1 will be described using FIGS. 6A and 6B.

As shown in FIG. 6A, according to an element structure of a light emitting element in this embodiment, an organic compound layer 602 is formed on an anode 601, a cathode 603 is formed on the organic compound layer 602, and a light emitting region 605 including a phosphor 610 is formed in a portion of the organic compound layer 602. In addition, in this embodiment, a hole transport layer 604 is formed under the light emitting region 605, and an electron transport layer 606 made of a low molecular weight material having an electron transport property is formed on the light emitting region 605.

Also, FIG. 6B shows in detail a composition of materials composing the organic compound layer 602. Note that a high molecular weight material 611 including N-vinylcarbazole as a repetition unit 607 is used in this embodiment. In addition, in this embodiment, N-vinylcarbazole is used as the repetition unit 607, a polymer having a degree of polymerization (n) of 50 or more is called a high polymer 608, and a polymer having a degree of polymerization (n) of 2 to 5 is called a low polymer 609.

Also, in this embodiment, the high polymer 608 can be dissolved in an organic solvent and the low polymer 609 is a material having a sublimation property.

Also, as the organic solvent for dissolving the high polymer in this embodiment, toluene, benzene, chlorobenzene, dichlorobenzene, chloroform, tetralin, xylene, dichloromethane, cyclohexane, NMP (N-methyl-2-pyrrolidone), dimethylsulfoxide, cyclohexanone, dioxane, THF (tetrahydrofuran), or the like can be used.

Also, a fluorescent material and a phosphorescent material which are similar to those indicated in Embodiment 1 can be used for the phosphor 610 in this embodiment. Here, $Ir(ppy)_3$ which is a triplet light emitting material is used.

Hereinafter, a method of manufacturing a light emitting element in this embodiment will be described. First, a solution in which a high molecular weight material is dissolved in an organic solvent is applied onto the anode 601 by a spin coating method to form a film. Note that, here, a high polymer including N-vinylcarbazole as a repetition unit is used and a solution in which the high polymer is dissolved in toluene is used. In addition, a high polymer including a fluorene-based compound as a repetition unit can be used in this embodiment.

After the film formation by the spin coating method, it is further heated at 80° C. for 30 minutes to remove toluene to form a film made of the high polymer 608.

Next, the low polymer 609 including N-vinylcarbazole as a repetition unit and $Ir(ppy)_3$ as the phosphor 610 are simultaneously coevaporated to form the light emitting region 605.

After the formation of the light emitting region 605, the electron transport layer 606 is formed from a low molecular weight material 613 by an evaporation method. Note that a film thickness of the electron transport layer 606 formed here is set to be 30 nm to 50 nm.

Note that the electron transport layer 606 formed in this embodiment includes a hole blocking layer. $Alq_3$, Almq, BAlq, $Zn(PBO)_2$, $Zn(PBT)_2$, or the like can be used as an organic compound having an electron transport property which composes the electron transport layer 606. In addition, a layer made of BCP, vathophenanthroline, PBD, or TAZ can be formed as the hole blocking layer to sandwich it between the light emitting region and the electron transport layer.

In this embodiment, BCP and $Alq_3$ are laminated to form the electron transport layer 606 made of the low molecular weight material 613.

By the above steps, the organic compound layer 602 which is made of the high molecular weight material and the low molecular weight material and partly includes the light emitting region 605 is formed on the anode 601, and then the cathode 603 is formed thereon. Aluminum can be used as a material composing the cathode 603. In addition, an alloy of magnesium and silver (hereinafter referred to as Mg:Ag), an alloy of magnesium and indium (hereinafter referred to as Mg:In), or an alloy of magnesium and copper (hereinafter referred to as Mg:Cu) can be used. Further, an alloy using calcium as alkali metal in addition to magnesium can be used.

Furthermore, an alloy of aluminum and lithium (hereinafter referred to as Al:Li) or the like can be used.

Also, an extremely thin film insulating layer made of a metallic oxide or a metallic fluoride can be formed in an interface between the cathode 603 and the organic compound layer 602. $Li_2O$, MgO, $Al_2O_3$, or the like can be used as the metallic oxide. LiF, $MgF_2$, $SrF_2$ or the like is used as the metallic fluoride and a film made of such a material is preferably formed at a film thickness of 0.5 nm to 1.5 nm.

By the above steps, the light emitting region 605 including the phosphor 610 at a desired position of the high molecular weight material 611 composed of the same repetition units can be formed in the organic compound layer 602 made of the high molecular weight material and the low molecular weight material. Thus the light emitting region 605 in the organic compound layer 602 can be set in a specific position. In addition, since a functional region using the low molecular weight material 613 can be formed, an element characteristic of the light emitting element can be further improved. In addition, since the light emitting region 605 can be formed at a distance from the electrodes in this embodiment, quenching due to energy transfer can be prevented.

[Embodiment 3]

Figure 7A:
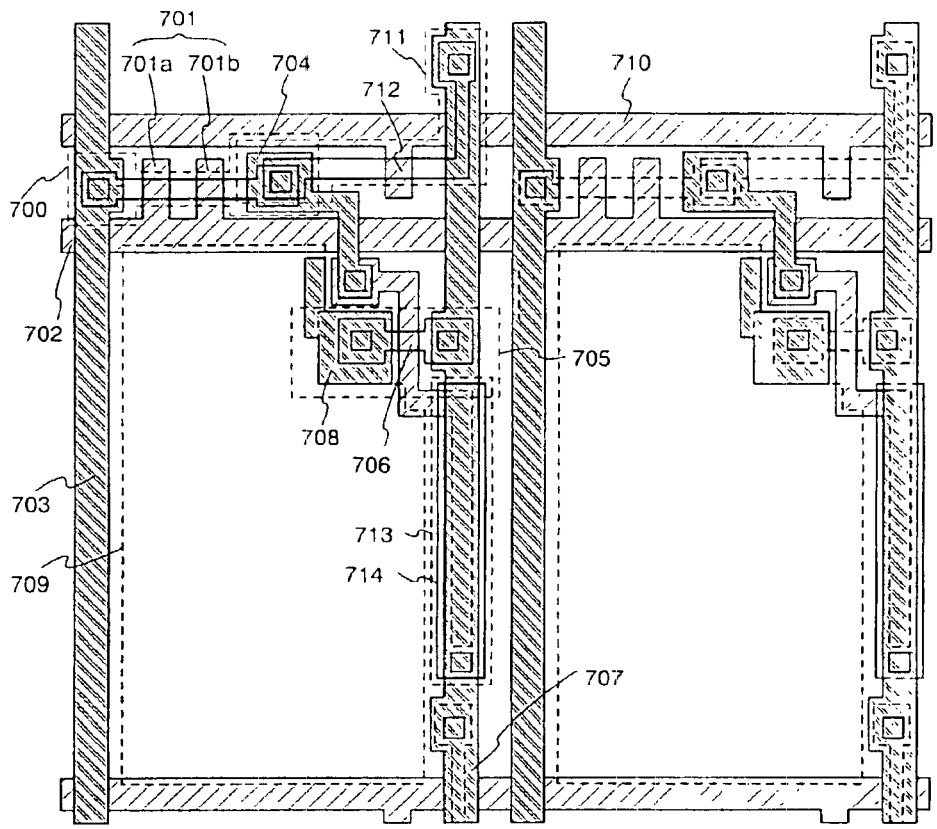
FIGS. 7A and 7B are top views showing a pixel portion of a light-emitting device.
Figure 7B:
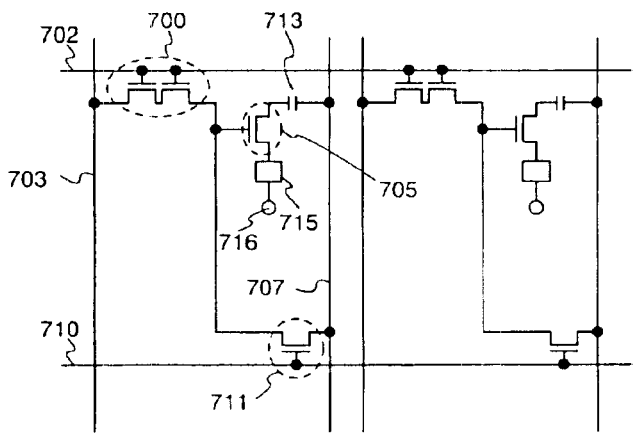

Here, FIG. 7A shows in detail a top structure of a pixel portion of the light-emitting device which is formed by the present invention and explained in Embodiment 1 and FIG. 7B is a circuit diagram. Since the common reference symbols are used in FIGS. 7A and 7B, these are preferably referred to each other.

In this embodiment, a TFT indicated by a region of reference numeral 702 is called a switching TFT, a TFT indicated by a region of reference numeral 706 is called a current control TFT, and both are made from the organic TFT of the present invention. Note that the source of a switching TFT 700 is connected with a source signal line 703 and the drain thereof is connected with a drain wiring 704. In addition, the drain wiring 704 is electrically connected with a gate electrode 706 of the current control TFT 705.

Also, a channel region of the switching TFT 700 is formed in contact with the source and the drain and overlapped with a gate electrode 701 (701a and 701b) electrically connected with a gate signal line 702.

Also, the source of the current control TFT 705 is electrically connected with a current supply line 707 and the drain thereof is electrically connected with a drain wiring 708. In addition, the drain wiring is electrically connected with an anode (pixel electrode) 709 indicated by a dotted line.

Note that the structure of this embodiment can be embodied by being freely combined with the structure of Embodiment 1 or the Embodiment 2.

[Embodiment 4]

In this embodiment, an appearance of an active matrix light-emitting device manufactured by the manufacturing method of the present invention will be described using FIGS. 8A and 8B. Note that FIG. 5A is a top view indicating the light-emitting device and FIG. 8B is a cross sectional view taken along the line A-A'of FIG. 8A. Reference numeral 801 indicated by a dotted line denotes a source signal line driver circuit, 802 denotes a pixel portion, and 803 denotes a gate signal line driver circuit. In addition, reference numeral 804 denotes a sealing substrate and 805 denotes a seal agent. A space 807 is produced in an inner region surrounded by the seal agent 805.

Note that reference numeral 808 denotes a wiring for transmitting signals inputted to the source side driver circuit 801 and the gate side driver circuit 803 and video signals and clock signals are received from an FPC (flexible printed circuit) 809 as an external input terminal. Although only the FPC 809 is shown here, a printed wiring board (PWB) may be attached to the FPC 809. The light-emitting device in this specification includes not only a main body of the light-emitting device but also the light-emitting device to which the FPC 809 or the PWB is attached.

Next, the cross sectional structure will be described using FIG. 8B. Although the driver circuits and the pixel portion are formed on a substrate 810, the source side driver circuit 801 as the driver circuit and the pixel portion 802 are indicated here.

Note that the source side driver circuit 801 is composed of a CMOS circuit in which an n-channel TFT 813 and a p-channel TFT 814 are combined. A TFT composing the driver circuit may compose a CMOS circuit, a PMOS circuit, or an NMOS circuit, which is known. In addition, although a driver-integrated type in which the driver circuits are formed on the substrate is indicated in this embodiment, such a type is not necessarily used and the driver circuits can be formed not on the substrate but in an external portion.

Also, the pixel portion 802 is composed of a plurality of pixels each including a current control TFT 811 and an anode 812 electrically connected with the drain thereof.

Also, an insulating layer 813 is formed in both ends of the anode 812 and a first organic compound layer 814, a light emitting region 815, and a second organic compound layer 816 are formed on the anode 812. Further, a cathode 817 is formed on the second organic compound layer 816. Thus, a light emitting element 818 composed of the anode 812, the organic compound layers, and the cathode 817 is produced.

The cathode 817 also serves as a wiring common to all pixels and is electrically connected with the FPC 809 through a connection wiring 808.

Also, in order to seal the light emitting element 818 formed on the substrate 810, the substrate 810 is bonded to the sealing substrate 804 through the seal agent 805. Note that a spacer made from a resin film may be provided to keep an interval between the sealing substrate 804 and the light emitting element 818. An inert gas such as nitrogen is sealed in the space 807 surrounded by the seal agent 805. Note that epoxy-based resin is preferably used as the seal agent 805. In addition, it is desirable that the seal agent 805 is a material which minimizes transmission of moisture and oxygen. Further, a substance having a hygroscopic effect and a substance having an oxidation protection effect may be included in the space 807.

Also, in this embodiment, a plastic substrate made of FRP (fiberglass-reinforced plastics), PVF (polyvinyl fluoride), Mylar, polyester, acrylic, or the like can be used as a material composing the sealing substrate 804 in addition to a glass substrate and a quartz substrate. In addition, the sealing substrate 804 is bonded to the substrate using the seal agent 805 and then it can be sealed by the seal agent so as to cover the side surface (exposed surface).

When the light emitting element is sealed in the space 807 by the above steps, it can be completely shut from the external and entering of substances for promoting deterioration of the organic compound layer such as moisture and oxygen from the external can be prevented. Thus, a light emitting element having high reliability can be obtained.

Note that the structure of this embodiment can be embodied by being freely combined with any structure of Embodiment 1 to Embodiment 3.

[Embodiment 5]

Figure 9:
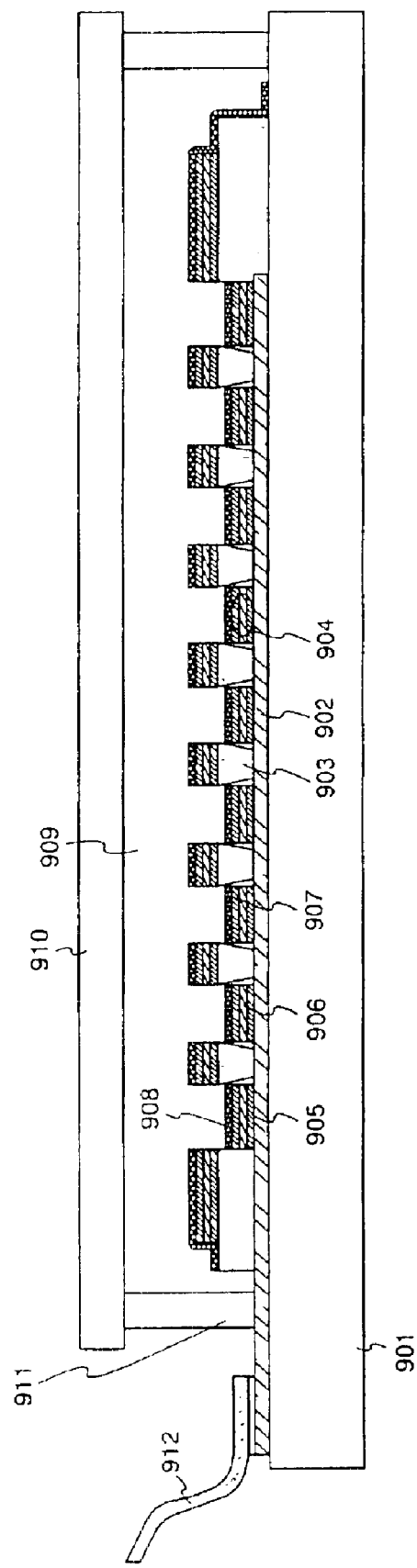
FIG. 9 is an explanatory view for showing a passive matrix light-emitting device.

In this embodiment, the case where a passive (simple matrix) light-emitting device having the element structure of the present invention is manufactured will be described. FIG. 9 is used for the description. In FIG. 9, reference numeral 901 denotes a glass substrate and 902 denotes an anode made from a transparent conductive film. In this embodiment, a compound of indium oxide and zinc oxide is formed for the transparent conductive film by an evaporation method. Note that, although not shown in FIG. 9, a plurality of anodes are arranged in a stripe shape parallel to a paper surface.

Also, banks 903 made of an insulating material are formed so as to cross the anodes 902 arranged in a stripe shape. The banks 903 are in contact with the anodes 902 and formed in a direction vertical to a paper surface.

Next, an organic compound layer 904 is formed. In this embodiment, first, a solution in which a high polymer of N-vinylcarbazole having a degree of polymerization (n) of 50 or more is dissolved in toluene is applied by a spin coating method and heated at 80° C. for 3 minutes to volatilize a solvent. Thus, a first organic compound layer 905 is formed at a film thickness of 50 nm to 150 nm.

Next, a low polymer of N-vinylcarbazole having a degree of polymerization (n) of 2 to 5 and a phosphor which possibly becomes a luminescent center are coevaporated to form a light emitting region 906 having a film thickness of 20 nm to 40 nm. Note that in this embodiment, the high polymer (608) can be dissolved in an organic solvent and the low polymer (609) is a material having a sublimation property.

Also, a fluorescent material and a phosphorescent material which are similar to those indicated in Embodiment 1 can be used for the phosphor in this embodiment.

Further, a low polymer of N-vinylcarbazole having a degree of polymerization (n) of 2 to 5 can be vapor-deposited on the light emitting region 906 to form a second organic compound layer 907. Thus, the organic compound layer 904 composed of the first organic compound layer 905, the light emitting region 906, and the second organic compound layer 907 can be formed. Since the organic compound layers 904 are formed along grooves produced by the banks 903, they are arranged in a stripe shape in a direction vertical to a paper surface.

Next, a cathode 908 is formed. Note that the cathode 908 is formed on the organic compound layer 904 by an evaporation method using a metallic mask.

Note that, since the lower electrode is made from the transparent anode 902 in this embodiment, light produced in the organic compound layer is emitted to the lower side (substrate 901 side).

Next, a ceramic substrate is prepared as a sealing substrate 910. In the structure of this embodiment, the ceramic substrate is used because of a preferable light shielding property. A substrate made of plastic or glass can be also used.

The thus prepared sealing substrate 910 is bonded to the resultant substrate through a seal agent 911 made of an ultraviolet curable resin. Note that an internal space 909 surrounded by the seal agent 911 becomes a closed space and is sealed with an inert gas such as nitrogen or argon. In addition, it is effective to provide a hygroscopic material represented by a barium oxide in the closed space 909. Finally, an FPC 912 is attached to the substrate to complete a passive light-emitting device. Note that, according to this embodiment, the organic compound layer can be formed by being freely combined with the materials indicated in Embodiment 1 or Embodiment 2.

[Embodiment 6]

Figure 12A:
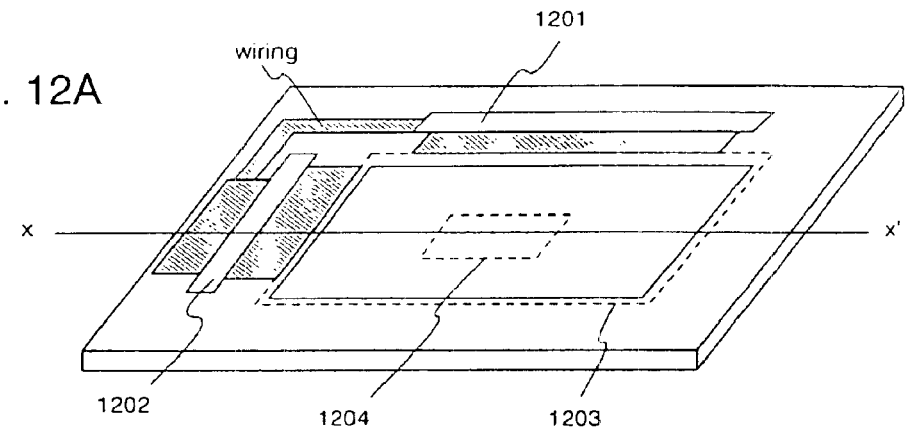
FIGS. 12A and 12B are explanatory views for showing a structure of an inverse stagger TFT.
Figure 12B:
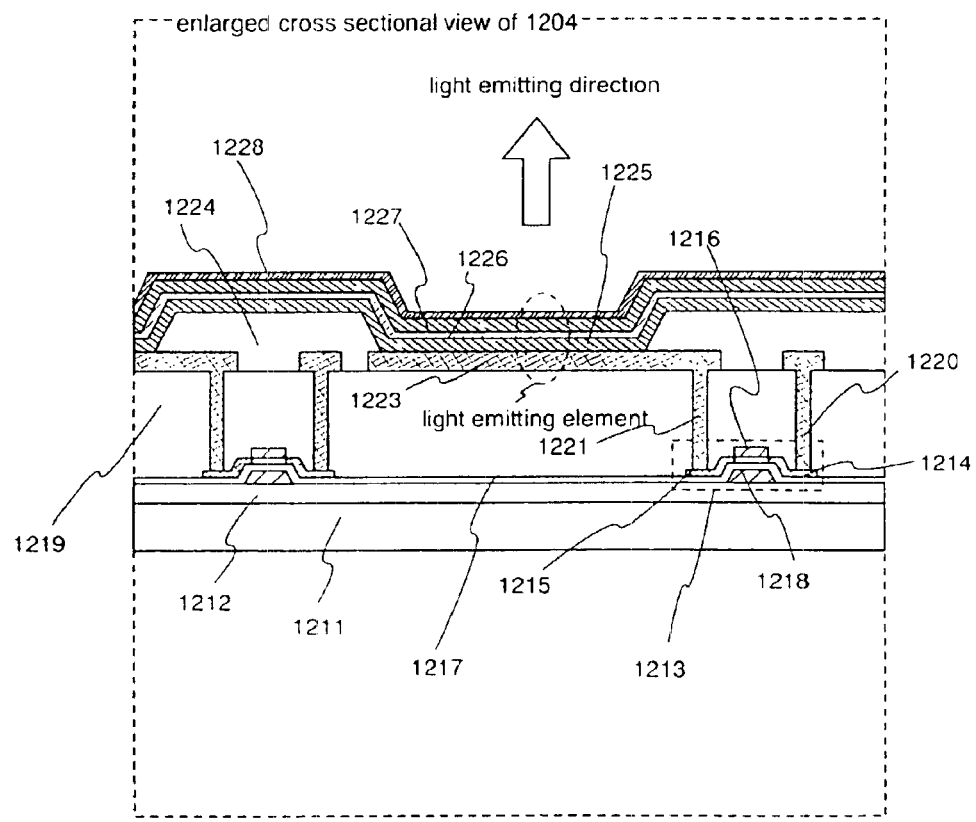

Although the active matrix light-emitting device having the top gate TFT is described in Embodiment 4, the present invention is not limited to such a TFT structure. Thus, as shown in FIGS. 12A and 12B, a light-emitting device may be embodied using a bottom gate TFT (typically, an inverse stagger TFT). In addition, the inverse stagger TFT may be formed by any means. Further, although the structure in which light produced by a light emitting element in the anode side (substrate side) is emitted (downward emission type) is used in Embodiment 4, a structure in which light is emitted from the cathode side (upward emission type) may be used as indicated in this embodiment.

Note that FIG. 12A is a top view of a light-emitting device using a bottom gate TFT. Now, sealing by a sealing substrate is not conducted. A source side driver circuit 1201, a gate side driver circuit 1202, and a pixel portion 1203 are formed on a substrate. FIG. 12B is a cross sectional view of a region 1204 in the pixel portion 1203 when the light-emitting device is cut along the line x-x' of FIG. 12A.

In FIG. 12B, only a current control TFT of TFTs formed in the pixel portion 1203 will be described. Reference numeral 1211 denotes a substrate and 1212 denotes an insulating film as a base (hereinafter referred to as a base film). A transparent substrate, typically, a glass substrate, a quartz substrate, a glass ceramic substrate, or a crystallized glass substrate can be used as the substrate 1211. However, it is required that the substrate is resistant to a maximum processing temperature in a manufacturing process.

Also, the base film 1212 is effective in the case when a substrate including a movable ion or a conductive substrate is particularly used, it may not be provided in a quartz substrate. An insulating film including silicon is preferably used as the base film 1212. Note that "the insulating film including silicon" in this specification indicates specifically an insulating film including oxygen or nitrogen to silicon at a predetermined ratio, such as a silicon oxide film, a silicon nitride film, or a silicon oxynitride film (SiOxNy: x and y are indicated by arbitrary integers).

Reference numeral 1213 denotes a current control TFT which is made from a p-channel TFT. Note that, since the anode of the light emitting element is connected with the current control TFT 1213 in this embodiment, it is desirable that the current control TFT is made from a p-channel TFT. However, the present invention is not limited to such a TFT and the current control TFT may be made from an n-channel TFT.

The current control TFT 1213 is composed of an active layer including a source region 1214, a drain region 1215, and a channel forming region 1216, a gate insulating film 1217, a gate electrode 1218, an interlayer insulating film 1219, a source wiring 1220, and a drain wiring 1221. In this embodiment, the current control TFT 1213 is a p-channel TFT.

Also, the drain region of the switching TFT is connected with the gate electrode 1218 of the current control TFT 1213. Although not shown, specifically, the gate electrode 1218 of the current control TFT 1213 is electrically connected with the drain region (not shown) of the switching TFT through a drain wiring (not shown). Note that, although the gate electrode 1218 becomes a single gate structure, it may become a multi-gate structure. In addition, the source wiring 1220 of the current control TFT 1213 is connected with a current supply line (not shown).

The current control TFT 1213 is an element for controlling the amount of current injected to the light emitting element and a relatively large amount of current is caused to flow thereinto. Thus, it is preferable that the channel width (W) is designed to be larger than that of the switching TFT. In addition, in order to prevent an excess current flowing into the current control TFT 1213, it is preferable that the channel length (L) is designed to be longer. Desirably, 0.5 $\mu$A to 2 $\mu$A per pixel (preferably, 1 $\mu$A to 1.5 $\mu$A per pixel) is set.

Also, a film thickness of the active layer (particularly, the channel forming region) of the current control TFT 1213 may be increased (to preferably, 50 nm to 100 nm, more preferably, 60 nm to 80 nm) to suppress the deterioration of the TFT.

After the formation of the current control TFT 1213, the interlayer insulating film 1219 is formed and an anode 1223 electrically connected with the current control TFT 1213 is formed. Note that a wiring for electrically connecting the current control TFT 1213 and the anode 1223 and the anode 1223 are simultaneously made of the same material in this embodiment. In addition, it is preferable that a conductive material having a larger work function is used as a material composing the anode 1223. Typically, there are cited metals such as nickel, palladium, tungsten, gold and silver. Note that in this embodiment, it is preferable that the anode 1223 is not transmissive of light. In addition to this, it is more preferable that a material having a high light reflecting property is used.

After the formation of the anode 1223, an insulating layer 1224 is formed. Note that the insulating layer 1224 is also called a bank.

Next, an organic compound layer is formed. Note that the organic compound layer in this embodiment has the same structure as that described in Embodiment 1. In other words, the organic compound layer is composed of a first organic compound layer 1225 made of a high polymer, a light emitting region 1226 formed by coevaporating a low polymer and a phosphor, and a second organic compound layer 1227 made of a low polymer. Note that the materials indicated in Embodiment 1 are preferably used as materials composing the organic compound layer.

Next, a cathode 1228 is formed on the organic compound layer. It is preferable that a conductive material having a work function of 2.5 eV to 3.5 eV is used as a material for the cathode 1228. Typically, a conductive film including an alkali metallic element or an alkali earth metallic element, a conductive film including aluminum or a film in which aluminum, silver, or the like is laminated on the conductive film is preferably used. Since this embodiment relates to an upward emission type, it is strictly assumed that the cathode 1228 has optical transparency. Thus, when these metals are used, an ultra thin film having a thickness of about 20 nm is preferable.

By the above steps, the light-emitting device having the inverse stagger TFT can be produced. Note that the light-emitting device manufactured in this embodiment can emit light in a direction indicated by an arrow (upward) as shown in FIG. 12B.

Since the inverse stagger TFT has a structure such that the number of steps is easily reduced as compared with the top gate TFT, it is very advantageous to a reduction in a manufacturing cost which is an object of the present invention.

Note that, according to the structure of the present embodiment, the light-emitting device having the element structure in which the inverse stagger TFT is provided and light is emitted from the anode side of the light emitting element is indicated. However, the element structure in which light is emitted from the cathode side of the light emitting element as indicated in this embodiment can be also combined with the top gate TFT indicated in Embodiment 4. In addition, the element structure in which light is emitted from the anode side of the light emitting element as indicated in Embodiment 4 can be combined with the inverse stagger TFT indicated in this embodiment. Further, the organic compound layer can be formed by being freely combined with the materials indicated in Embodiment 1 and Embodiment 2.

[Embodiment 7]

A light-emitting device using a light emitting element is of a self-luminous type and thus has superior visibility in bright surroundings with a wider viewing angle as compared with a liquid crystal display device. Therefore, the light-emitting device can be applied to display portions of various electric appliances.

Examples of the electric appliance employing the light-emitting device manufactured according to the present invention include a video camera, a digital camera, a goggle type display (head mounted display), a navigation system, an audio reproducing device (car audio system, audio component system, etc.), a notebook computer, a game machine, a personal digital assistant (mobile computer, mobile telephone, portable game machine, electronic book, etc.) and an image reproducing device provided with a recording medium (specifically, a device adapted to reproduce a recording medium such as a digital versatile disc (DVD) and provided with a display device capable of displaying an image thereof). In particular, as for the personal digital assistant the screen of which is viewed form the side in many cases, it is highly required to have a wide viewing angle, so that the light-emitting device having the light emitting element is preferably applied thereto. FIGS. 10A to 10H show specific examples thereof.

Figure 10A:
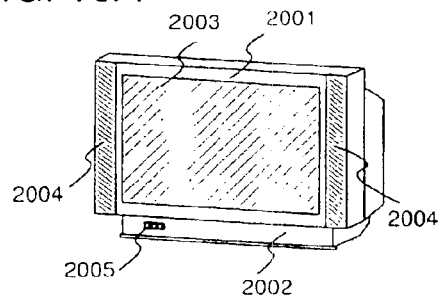
FIGS. 10A to 10H show examples of electric appliances.

FIG. 10A shows a display device, which contains parts such as a frame 2001, a support 2002, a display portion 2003, a speaker portion 2004, and a video input terminal 2005. The light-emitting device of the present invention can be used in the display portion 2003. The light-emitting device including the light emitting element is of the self-luminous type, so it requires no backlight and realizes thin display portion as compared with the liquid crystal display device. Note that display devices include all display devices for displaying information, for example, one for personal computers, one for receiving television broadcasting, and one for advertisement.

Figure 10B:
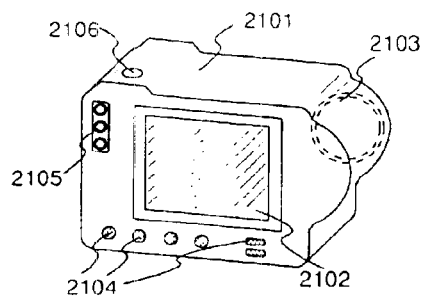

FIG. 10B shows a digital still camera, which contains parts such as a main body 2101, a display portion 2102, an image-receiving portion 2103, operation key 2104, an external connection port 2105, and a shutter 2106. The light-emitting device of the present invention can be used in the display portion 2102.

Figure 10C:
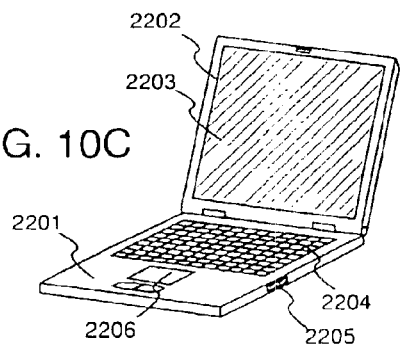

FIG. 10C shows a notebook computer, which contains parts such as a main body 2201, a frame 2202, a display portion 2203, a keyboard 2204, external connection ports 2205, and a pointing mouse 2206. The light-emitting device of the present invention can be used in the display portion 2203.

Figure 10D:
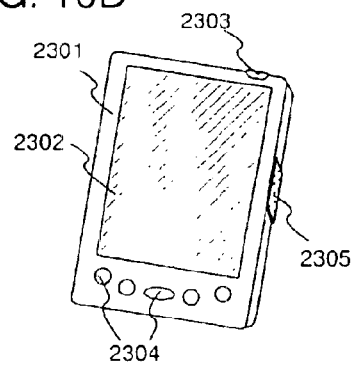

FIG. 10D shows a mobile computer, which contains parts such as a main body 2301, a display portion 2302, a switch 2303, operation keys 2304, and an infrared port 2305. The light-emitting device of the present invention can be used in the display portion 2302.

Figure 10E:
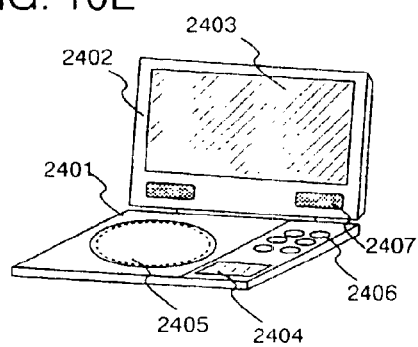

FIG. 10E shows a portable image reproducing device provided with a recording medium (specifically, a DVD playback device), which contains parts such as a main body 2401, a frame 2402, a display portion A 2403, a display portion B 2404, a recording medium (such as a DVD) read-in portion 2405, operation keys 2406, and a speaker portion 2407. The display portion A 2403 mainly displays image information, and the display portion B 2404 mainly displays text information, and the light-emitting device of the present invention can be used in the display portion A 2403 and in the display portion B 2404. Note that home game machines and the like are included in the category of image reproducing devices provided with a recording medium.

Figure 10F:
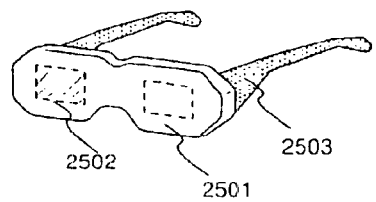

FIG. 10F shows a goggle type display (head mounted display), which contains a main body 2501, a display portion 2502, and an arm portion 2503. The light-emitting device of the present invention can be used in the display portion 2502.

Figure 10G:
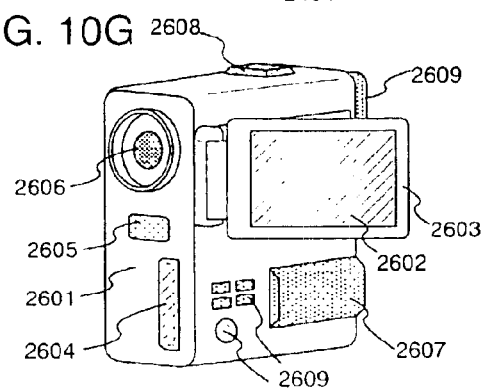

FIG. 10G shows a video camera which contains parts such as a main body 2601, a display portion 2602, a frame 2603, external connection ports 2604, a remote control receiving port 2605, an image receiving portion 2606, a battery 2607, an audio input portion 2608, and operation keys 2609. The light-emitting device of the present invention can be used in the display portion 2602.

Figure 10H:
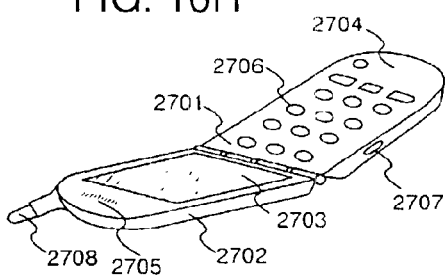
Figure 11:
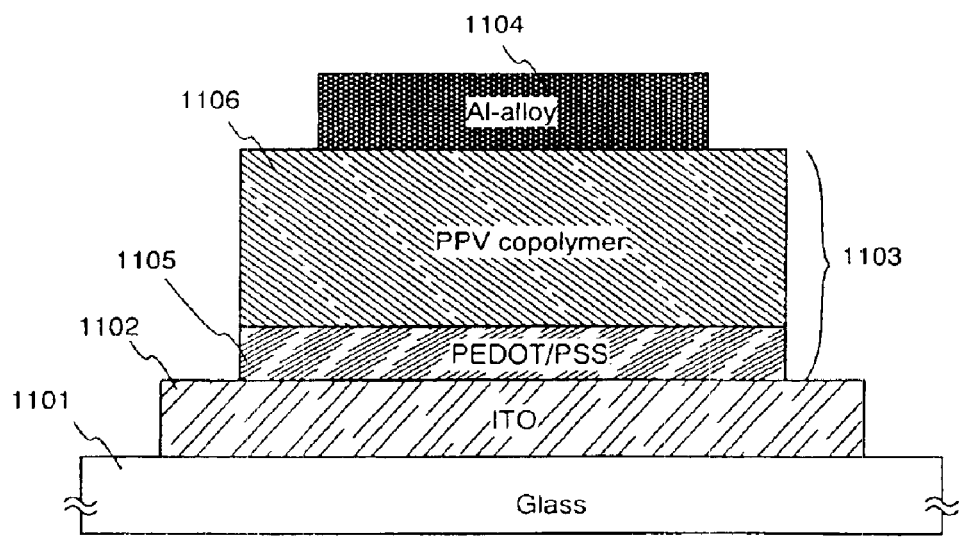
FIG. 11 an explanatory view for showing a conventional example of a light-emitting device.

Here, FIG. 10H shows a portable telephone, which is composed of a main body 2701, a frame 2702, a display portion 2703, an audio input unit 2704, an audio output unit 2705, operation keys 2706, external connecting ports 2707, and an antenna 2708. The light-emitting device of the present invention can be used in the display portion 2703. Note that, by displaying white color characters on a black color background in the display portion 2703, it is possible to suppress the power consumption of the mobile telephone.

Note that, if the light emission luminance of the organic material is improved in future, the application to a front-type or rear-type projector can be also realized in which a light holding the outputted image information is magnified with a lens or the like to be projected.

Further, the above-mentioned electric appliance has been often adapted to display information distributed through an electronic communication line such as Internet or CATV (cable television). Especially, there has increased the frequency of displaying moving image information. The organic material has a high response speed and thus the light-emitting device using the organic material is preferably used for displaying the moving image.

Also, in the light-emitting device, a light emitting portion consumes electric power. Therefore, it is preferred that information is displayed in such a manner that the light emitting portion is reduced as much as possible. Accordingly, in the case where the light-emitting device is applied to the display portion which mainly displays the text information as seen in the personal digital assistant, particularly, the mobile telephone or audio reproducing device, driving is preferably performed so that the text information is formed by using the light emitting portion while a portion emitting no light is used as background.

As described above, the light-emitting device according to the manufacturing method of the present invention can be applied to electric appliances in any field with an extremely wide application range. Also, the electric appliance of this embodiment can use as the display portion thereof the light-emitting device manufactured in accordance with Embodiment 1 to Embodiment 6.

[Embodiment 8]

Generally, it is difficult to obtain a laminate structure utilizing a dissolving characteristic of a high molecular weight material. In this embodiment, the case where solvents having different solubilities to the high polymer and the low polymer in the present invention are found and then the high polymer and the low polymer are dissolved in different solvents and a laminate composed of them is produced by a spin coating method will be indicated.

First, a mixture aqueous solution of polyethylene dioxythiophene/polystyrene sulfonate (abbreviated form: PEDOT/PSS) is applied by a spin coating method onto a glass substrate in which ITO as an anode is formed into a film at a thickness of about 100 nm and moisture is evaporated to form a hole injection layer having a thickness of 30 nm. Next, 2,5-dialkoxy-poly (paraphenylene) (abbreviated form: RO-PPP) (the following formula (1)) as a high polymer is dissolved in toluene and a film having a thickness of 50 nm is formed by a spin coating method to produce a hole transport layer.

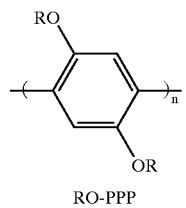

RO-PPP

Next, RO-5P (the following formula (2)) as a low polymer (oligomer) of RO-PPP and rubrene as a dopant are dissolved in a ketone-based solvent (cyclohexanone or the like) and a film is formed as a light emitting region at a thickness of about 20 nm. Since RO-PPP is hard to dissolve against a ketone-based solvent, there is no case where the hole transport layer and the light emitting region are mixed. Note that the light emitting region in this time may be formed in not a layer shape but a cluster shape.

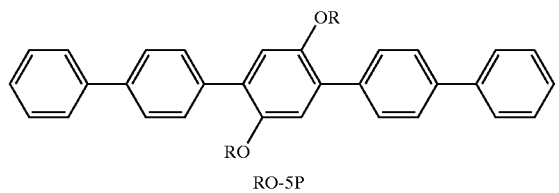

RO-5P

Note that the laminate produced by only a spin coating method as described above can be used as the organic compound layer in this embodiment. However, in this case, since a structure in which the light emitting region is formed in contact with a cathode formed next is obtained, quenching is easy to cause. Thus, in order to produce light emission at higher efficiency in this embodiment, it is desirable that an electron transport layer is formed between the light emitting region and the cathode by an evaporation method. Triazole derivative (TAZ) or the like can be used as a material composing the electron transport layer. Finally, an Al:Li alloy is evaporated as the cathode at a thickness of 150 nm to obtain the light emitting element of the present invention.

By implementing the present invention, the light emitting region in the light-emitting device using the high molecular weight material for the organic compound layer can be set in a desired position, whereby the element characteristic of the light emitting element can be improved. In addition, since the structure in which the light emitting region is distanced from the anode and the cathode can be obtained, quenching due to energy transfer from the light emitting region can be prevented.

What is claimed is:

1. A light-emitting device comprising:

a light emitting element, wherein the light emitting element comprises an anode, an organic compound layer, and a cathode, wherein the organic compound layer comprises a first layer including a high polymer of an organic material on the anode, a second layer including a low polymer of the organic material and a phosphor on the first layer, and wherein the low polymer of the organic material and the phosphor are formed in a same layer.

2. A light-emitting device comprising:

a light emitting element, wherein the light emitting element comprises an anode, an organic compound layer, and a cathode, wherein the organic compound layer comprises a first layer including a high polymer of an organic material on the anode, a second layer including a low polymer of the organic material and a phosphor on the first layer, wherein the high polymer and the low polymer have a repetition unit of the organic material, and wherein he low polymer of the organic material and the phosphor are formed in a same layer.

3. A light-emitting device comprising:

a thin film transistor formed over a substrate having an insulating surface; and a light emitting element electrically connected with the thin film transistor, wherein the light emitting element comprises an anode, an organic compound layer, and a cathode, wherein the organic compound layer comprises a first layer including a high polymer of an organic material on the anode, a second layer including a low polymer of the organic material and a phosphor on the first layer, and wherein he low polymer of the organic material and the phosphor are formed in a same layer.

4. A light-emitting device comprising:

a thin film transistor formed over a substrate having an insulating surface; and a light emitting element electrically connected with the thin film transistor, wherein the light emitting element comprises an anode, an organic compound layer, and a cathode, wherein the organic compound layer comprises a first layer including a high polymer of an organic material on the anode, a second layer including a low polymer of the organic material and a phosphor on the first layer, wherein the high polymer and the low polymer have a repetition unit of the organic material, and wherein the low polymer of the organic material and the phosphor are formed in a same layer.

5. A light-emitting device comprising:

a light emitting element, wherein the light emitting element comprises an anode, and a cathode with an organic compound layer interposed therebetween, wherein the organic compound layer comprises a first layer including a high polymer of an organic material on the anode, a second layer including a low polymer of the organic material and a phosphor on the first layer, and a third layer including a low polymer of the organic material on the second layer, and wherein the low polymer of the organic material and the phosphor are formed in a same layer.

6. A light-emitting device according to any one of claims 1, 3 and 5, wherein the organic material comprises one of N-vinylcarbazole and fluorene as a repetition unit.

7. A light-emitting device comprising:

a light emitting element, wherein the light emitting element comprises an anode, and a cathode with an organic compound layer interposed therebetween, wherein the organic compound layer comprises a first layer including a high polymer of an organic material on the anode, a second layer including a low polymer of the organic material and a phosphor on the first layer, and a third layer including a low polymer of the organic material on the second layer, wherein the high polymer and the low polymer have a repetition unit of the organic material, and wherein the low polymer of the organic material and the phosphor are formed in a same layer.

8. A light-emitting device according to any one of claims 1 to 7, wherein the low polymer has a degree of polymerization of 2 to 5 and the high polymer has a degree of polymerization of 50 or more.

9. A light-emitting device according to any one of claims 1 to 7, wherein the phosphor comprises at least one selected from the group consisting of 1,1,4,4-tetraphenyl-1,3-butadiene, 4,4'-bis(N-(1-naphthyl)-N-phenyl-amino)-biphenl, perylene, coumarin 6, 4-dicyanomethylene-2-methyl-6-(p-dimethylamino-styryl)-4H-pyran, 4-dicyanomethylene-2-methyl-6-(julolidine-4-yl-vinyl)-4H-pyran, rubrene, Nile Red, N,N'-dimethyl-quinacridone, anthracene, pyrene, 9,10-diphenylanthracene, tris(2-phenylpyridine)iridium, and 2,3,7,8,12,13,17,18-octaethyl-21H,23H-porphyrin-platinum.

10. A light-emitting device according to any one of claims 1 to 7, wherein the light-emitting device is incorporated in at least one selected from the group consisting of a display device, a digital still camera, a notebook computer, a mobile computer, a portable image reproducing device including a recording medium, a goggle type display, a video camera, and a portable telephone.

11. A light-emitting device according to any one of claims 2, 4, and 7, wherein the organic material comprises one of N-vinylcarbazole and fluorene as the repetition unit.

* * * * *

UNITED STATES PATENT AND TRADEMARK OFFICE
CERTIFICATE OF CORRECTION

| | |
|---|---|
| PATENT NO. | : 6,908,695 B2 |
| APPLICATION NO. | : 10/189439 |
| DATED | : June 21, 2005 |
| INVENTOR(S) | : Satoshi Seo et al. |

It is certified that error appears in the above-identified patent and that said Letters Patent is hereby corrected as shown below:

On the Title page item 56, in the "OTHER PUBLICATIONS" section, replace "1987, vol. 55, No. 9, pp. 3510-3516" with --Vol. 65, No. 9, May 1, 1989, pp. 3610-3616--.

Signed and Sealed this

Twenty-second Day of May, 2007

JON W. DUDAS
*Director of the United States Patent and Trademark Office*